US010263579B2

(12) United States Patent
Zhou

(10) Patent No.: US 10,263,579 B2
(45) Date of Patent: Apr. 16, 2019

(54) DIFFERENTIAL AMPLIFIER

(71) Applicant: HEWLETT PACKARD ENTERPRISE DEVELOPMENT LP, Houston, TX (US)

(72) Inventor: Dacheng Zhou, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/336,931

(22) Filed: Oct. 28, 2016

(65) Prior Publication Data

US 2018/0123525 A1    May 3, 2018

(51) Int. Cl.
*H03F 3/45* (2006.01)

(52) U.S. Cl.
CPC ..... *H03F 3/45632* (2013.01); *H03F 3/45192* (2013.01); *H03F 2203/45112* (2013.01); *H03F 2203/45212* (2013.01)

(58) Field of Classification Search
CPC .... H03F 3/45; H03F 3/45179; H03F 3/45183; H03F 3/45188; H03F 1/307; H03F 3/30; H03F 3/3001; H03F 3/3022; H03F 3/45071
USPC .......................................... 330/253, 255.261
See application file for complete search history.

(56) References Cited

U.S. PATENT DOCUMENTS

| | | | |
|---|---|---|---|
| 5,963,053 A | 10/1999 | Manohar et al. | |
| 6,377,120 B1* | 4/2002 | Hsieh | H03F 3/45188 330/261 |
| 6,624,697 B2* | 9/2003 | Taylor | H03F 3/45192 330/261 |
| 6,924,702 B2 | 8/2005 | Chen | |
| 6,982,597 B2* | 1/2006 | Mitarashi | H03F 3/45192 330/261 |
| 7,113,042 B2* | 9/2006 | Richard | H03F 1/26 330/253 |
| 7,349,681 B2* | 3/2008 | Ou | H03K 19/00315 330/261 |
| 7,429,881 B2 | 9/2008 | Deng et al. | |
| 7,474,154 B1* | 1/2009 | Lee | H03F 3/45188 330/260 |
| 7,652,937 B2 | 1/2010 | Searles et al. | |
| 7,729,168 B2 | 6/2010 | Zumkehr et al. | |
| 7,994,858 B2* | 8/2011 | Standley | H03F 1/523 330/253 |
| 8,410,814 B2 | 4/2013 | Scott et al. | |
| 2003/0016086 A1* | 1/2003 | Yang | H03F 1/223 330/311 |
| 2004/0183597 A1* | 9/2004 | Mitarashi | H03F 3/45192 330/253 |
| 2008/0252375 A1* | 10/2008 | Tso | H03F 3/3022 330/261 |

(Continued)

OTHER PUBLICATIONS

Bazes, M., "Two Novel Fully Complementary Self-Biased CMOS Differential Amplifiers," (Research Paper), Fig. 3.c, IEEE Journal of Solid-State Circuits 26.2, 1991, pp. 165-168.

(Continued)

*Primary Examiner* — Khanh V Nguyen
(74) *Attorney, Agent, or Firm* — Hewlett Packard Enterprise Patent Department

(57) ABSTRACT

A differential amplifier includes a pair of cascode amplifiers. A voltage clamp is coupled to the pair of cascode amplifiers.

19 Claims, 5 Drawing Sheets

(56) References Cited

U.S. PATENT DOCUMENTS

2011/0157146 A1* 6/2011 Nishi .................. G09G 3/20
                                                     345/212

OTHER PUBLICATIONS

Geiger, R. L., "CMOS Differential Amplifiers," (Research Paper), Fig. 6.3-4, VLSI Design Techniques for Analog and Digital Circuits, vol. 90, 1990, 12 pages, available at http://www.uniroma2.it/didattica/PCSV/deposito/analog_2_dispense_08-09.pdf.

Fujisawa, H. et al., "1.8-V 800-Mb-is/pin DDR2 and 2.5-V 4.00-Mb-is/pin DDR1 Compatibly Designed 1Gb SDRAM with Dual-clock input-latch Scheme and Hybrid Multi-oxide Output Buffer," (Research Paper), Apr. 25, 2005, 5 pages, available at http://ieeexplore.ieee.org/document/1424216/.

* cited by examiner

DIFFERENTIAL AMPLIFIER

BACKGROUND

An amplifier is an active device for increasing the power of a signal. The amplifier accomplishes this by taking energy from a power supply and controlling the output to duplicate the input signal but with a larger amplitude.

BRIEF DESCRIPTION OF THE DRAWINGS

Certain examples are described in the following detailed description and in reference to the drawings, in which.

DETAILED DESCRIPTION OF SPECIFIC EXAMPLES

Implementations of the disclosed technology provide a common circuit design that may be used in input/output (IO) devices of varying specifications. For example, the disclosed circuitry may be used in DDR memory receivers and transmitters supporting various DDR standards. For example, the circuitry may be implemented in a DDR4, DDRT, DDR3, or DDR2 transmitter or receiver.

These varying protocols may impose different requirements on the IO devices. For example, various DDR protocols require different supply voltages (VDDQ). For example, between DDR4, DDR3, and DDR2, VDDQ ranges from 1.14V to 1.575V. The input signal to be received may be in either single-ended and differential mode, and may vary between 0V to 1.575V. For DDR4, the data rate is up to 3.2 Gbps with a DC sensitivity of +/−65 mV. Additionally, a signal level shifts from VDDQ to core supply voltage (VDD) (e.g., 1.14V to 0.85V for DDR4 and 1.575V to 0.85V for DDR3) may be supported. Additionally, for DDR4 and DDRT, the input common mode range may vary between 0.57V to 1.05V with a 1.14V power supply.

To tolerate the 1.5 IO supply and input signal level in DDR3, high-voltage IO fets are commonly used for receiver design. For example, at the 16 nm process, a typical transistor may be a 1.8u15 transistor with a channel length greater than or equal to 86 nm and a threshold voltage (Vthreshold) greater than 0.45V. However, these transistors may be too slow to meet higher speed requirements, such as the 3.2 Gbps DDR4 requirements. Transistors, such as thin film oxide transistors may be fast enough to meet the speed requirements at lower voltages, however they may be damaged when exposed to the higher voltages of DDR3. Accordingly, typical DDR receivers are designed for the application-specific protocol.

In some implementations, the disclosed circuits may be employed in various DDR receivers without modification. For example, the described circuits may allow thin film oxide transistors to be used in DDR3 implementations. A common circuit design may be used in applications across multiple protocols, reducing design costs.

Figure 1:
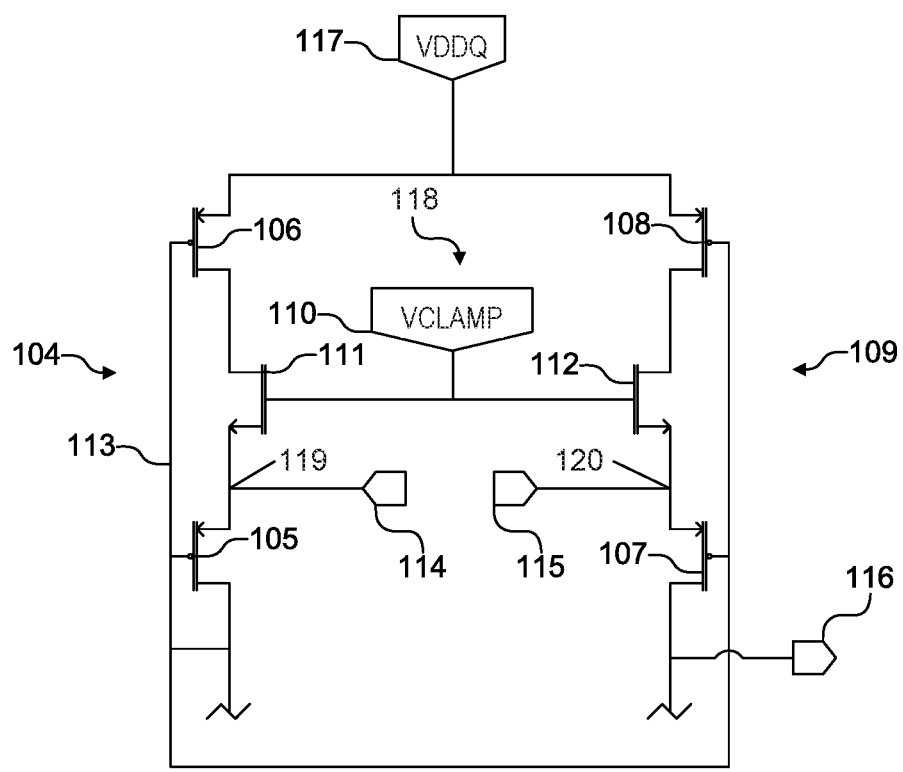
FIG. 1 illustrates a differential amplifier including a pair of cascode amplifiers and a voltage clamp.

FIG. 1 illustrates a differential amplifier including a pair of cascode amplifiers and a voltage clamp.

The illustrated amplifier includes a first differential signal input 114 connected to a first cascode amplifier 104. The first differential signal input 114 may include circuitry such as an input transistor to allow the input 114 to operate as a current mode differential input. The first cascode amplifier 104 may comprise a pair of transistors 105 and 106. For example, the transistors 105, 106 may comprise thin film oxide p-type field effect transistors (pFETs).

The illustrated amplifier further includes a second differential signal input 115 connected to a second cascode amplifier 109. Similarly to the first input 114, the second input 115 may be a current mode differential input, and may include circuitry such as an input transistor. For example, the second cascode amplifier 109 may comprise a pair of transistors 107 and 108. For example, the transistors 107, 108 may comprise thin film oxide p-type field effect transistors (pFETs).

In some implementations, the differential amplifier is in a folded cascode arrangement with the second cascode amplifier 109 connected to the first cascode 104 and a single-ended output 116 as illustrated. Additionally, the amplifiers may be self-biased via line 113.

The illustrated amplifier further includes a voltage clamping circuit 118. The voltage clamping circuit 118 may include a clamp voltage source 110 connected to the gates of a first clamp transistor 111 and a second clamp transistor 112. For example, the transistors 110, 111 may comprise thin film oxide n-type field effect transistors (nFETs). The clamp voltage source 110 provides a voltage Vclamp that controls the flow of current through transistors 111 and 112. Depending on Vclamp, the voltage at nodes 119 and 120 is limited to a certain amount to ensure proper operation of the transistors 105-108. For example, Vclamp may be set to limit the voltage at 119 and 120 less than the operational voltage for the transistors used in the cascode amplifiers. For example, for thin film oxide FETs, Vclamp may be set to limit the voltage at 119 and 120 to less than 0.9V. For example, a Vclamp of 1.2V may suffice for multiple DDR protocols, such as DDR2, DDR3, DDR4, and DDRQ. In other implementations, Vclamp may be configured based on the supply voltage VDDQ dictated by the protocol and desired voltage limit.

Figure 2:
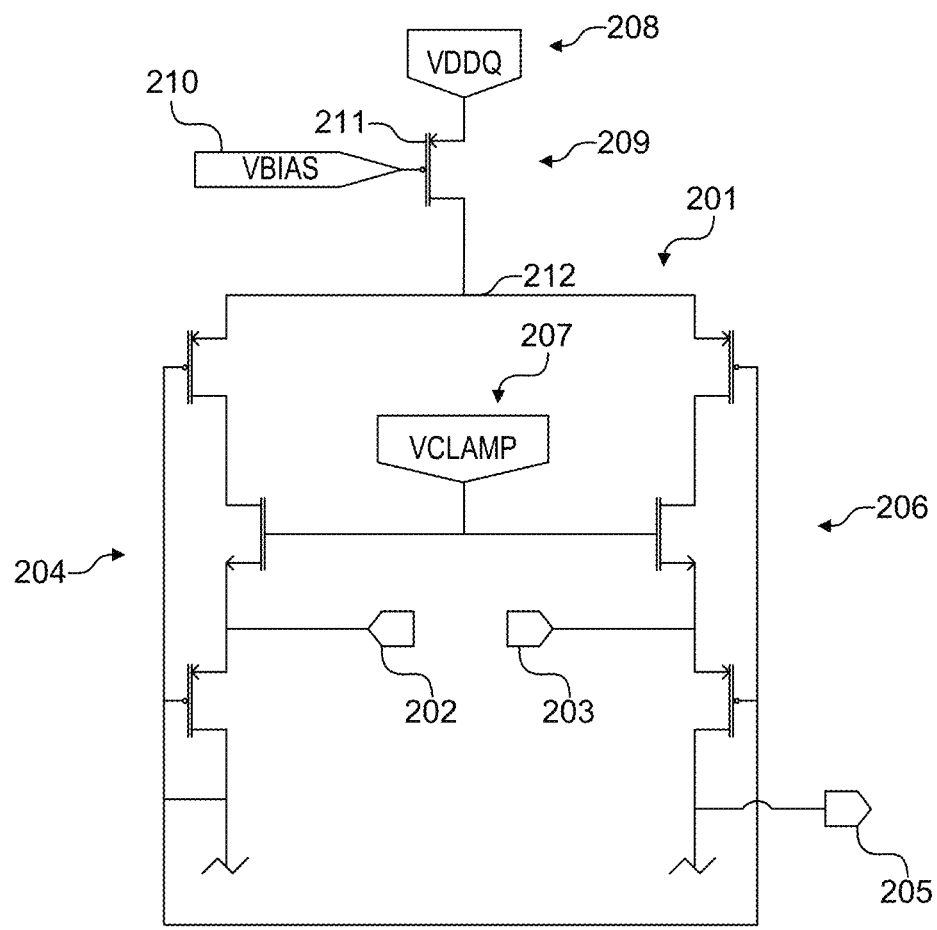
FIG. 2 illustrates an amplifier device including a tail current control circuit.

In some implementations, additional circuitry may be used to protect the high-speed transistors from higher voltage supplies associated with slower protocols. FIG. 2 illustrates an amplifier device including a tail current control circuit.

The device includes differential amplifier circuitry 201. In some implementations, the circuitry 201 may be as described with respect to the differential amplifier of FIG. 1. For example, the circuitry 201 may include a first differential signal input 202 connected to a first cascode amplifier 204. In this example, a second differential signal input 203 is connected to a second cascode amplifier 206 and a signal output 205 is connected to the first and second cascode amplifiers 204, 206. Additionally, a voltage swing clamp circuit 207 is connected to the first and second cascode amplifiers 204, 206.

In this example, the receiver device further includes a VDDQ voltage supply 208 coupled to the circuitry 201. The device further includes a tail current control circuit 209 connected between the supply 208 and the first and second cascode amplifiers 204, 206. The tail current control circuit limits the voltage at node 212 to a predetermined level. For example, limiting the voltage at node 212 to 1.2V may be sufficient to protect the circuitry 201 from higher DDR3 voltages while allowing the circuitry 201 to operate at DDR3 speeds. In other implementations, the voltage limit may be configured based on the specific standard and voltage requirements for the application.

In the illustrated example, the circuit 209 comprises a transistor 209 controlled by a bias voltage source 210. For example, the circuit 209 may comprise a pFET with its source connected to the voltage supply rail 208, its gate connected to the bias voltage source 210 and its drain connected to circuitry 201. This arrangement may provide for coarse-grained voltage limiting without more complex voltage regulation circuitry.

Figure 3A:
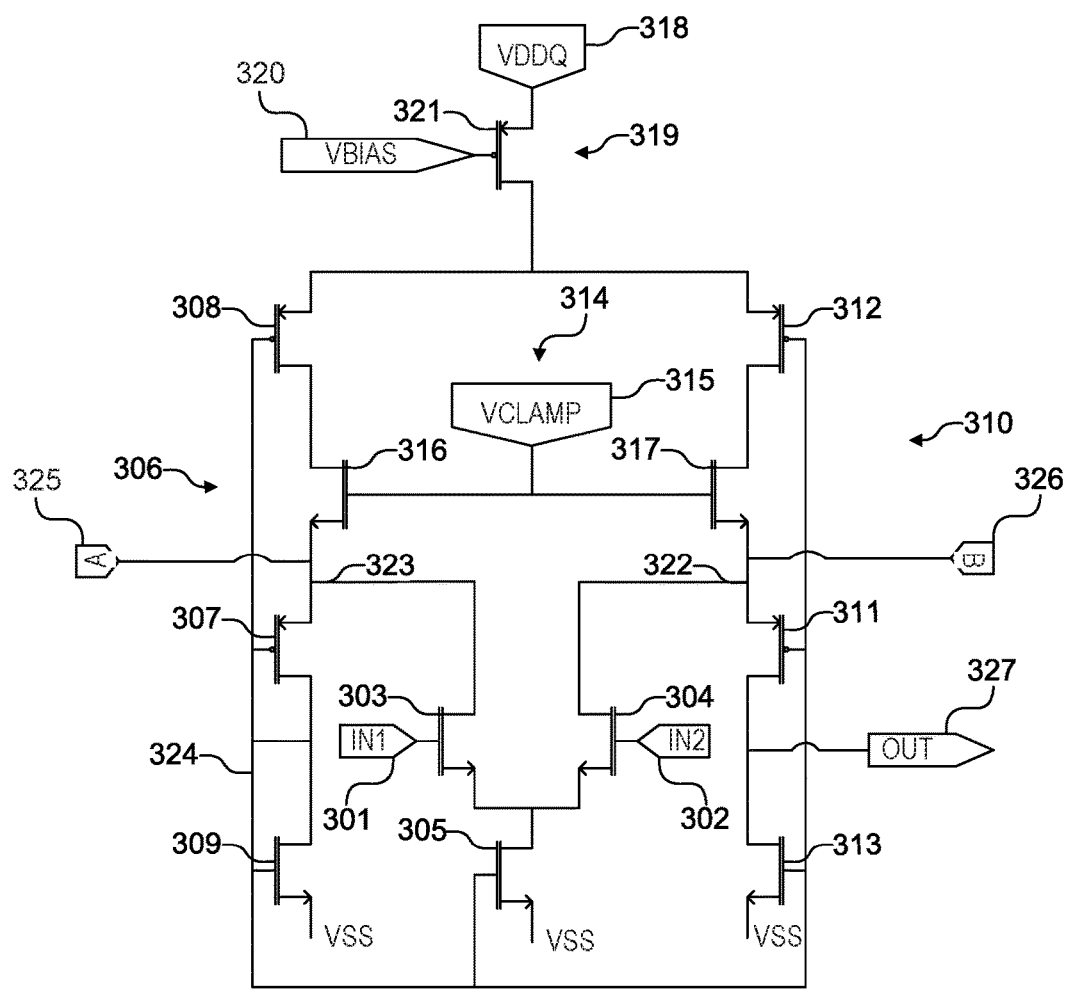
FIGS. 3A and 3B illustrate a device including a differential amplifier (FIG. 3A) having including output loading circuitry and calibration circuitry (FIG. 3B)
Figure 3B:
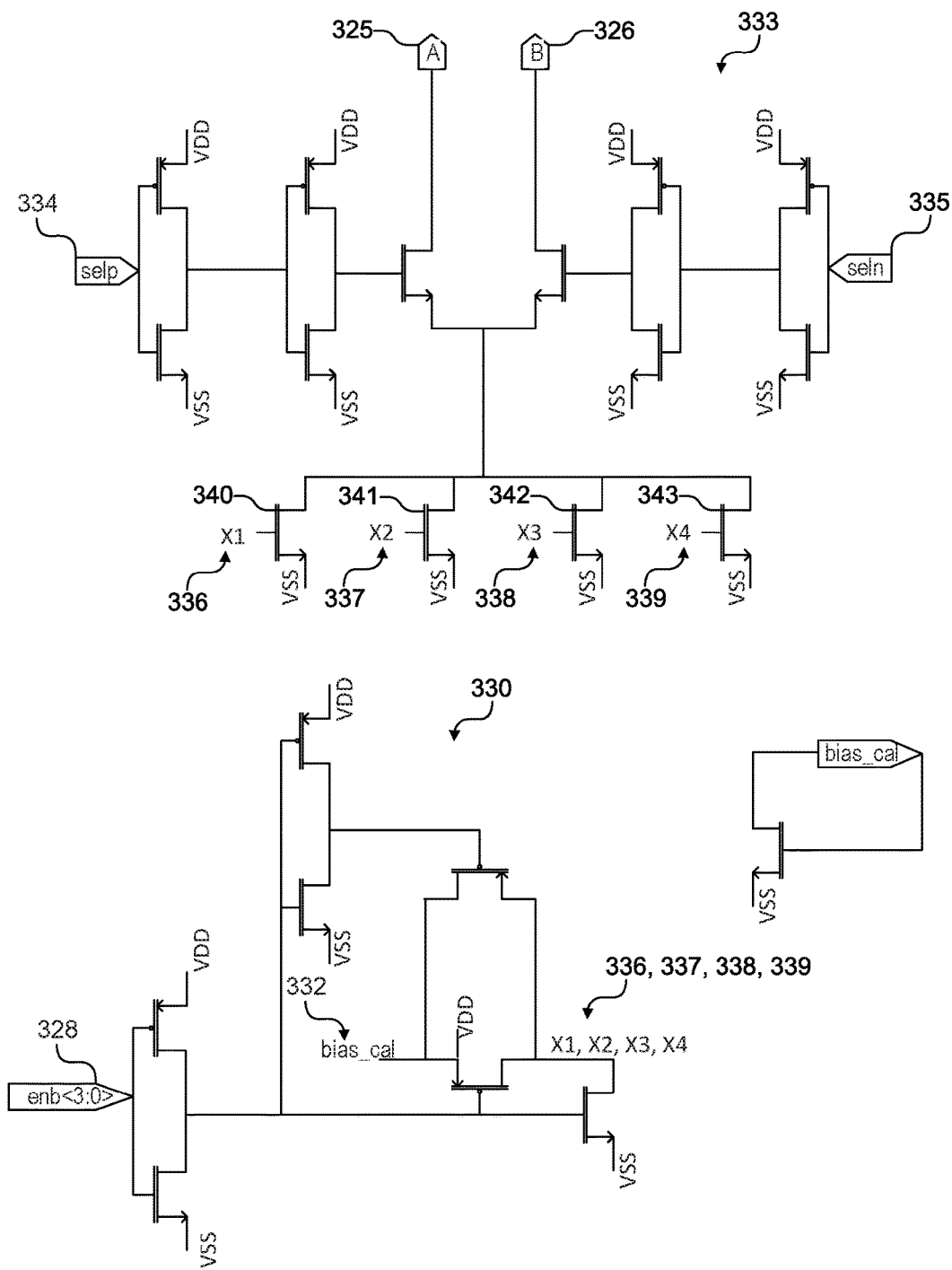

FIGS. 3A and 3B illustrate a device including a differential amplifier (FIG. 3A) having including output loading circuitry and calibration circuitry (FIG. 3B).

The amplifier device includes a first differential signal input 301 connected to a first cascode amplifier 306. As described with respect to FIG. 1, the first cascode amplifier 306 may include a first pair of transistors 307, 308. The amplifier device includes a second differential signal input 302 connected to a second cascode amplifier 310. The second amplifier 310 may include a second pair of transistors 311, 312. As illustrated the inputs 301, 302 may be connected to the gates of corresponding input transistors 303, 304. Input transistor 303 is connected to the cascode amplifier 306 at node 323 and to ground via transistor 305. Input transistor 304 is connected to the cascode amplifier 310 at node 322 and to ground via transistor 305. The differential pair 303, 304 and tail current transistor 305 provide the differential amplifier's current gain.

The device further includes a voltage swing clamp circuit 314 connected to the amplifiers 306, 310. For example, the circuit 314 may include a clamp voltage source 315 connected to a gate of a first clamp transistor 316 interposed between the first pair of transistors 307 and 308. The source 315 is further connected to the gate of a second clamp transistor 317 interposed between the second pair of transistors 311, 312. As an example, the clamp transistors 316, 317 may comprise n-type FETs (nFETs).

The amplifiers 306, 310 are self-biased via line 324 and further include high impedance output loading transistors 309, 313. The self-biasing line 324 provides self-regulation of the transistors' currents. The output loading transistors 309, 313 provide high-impedance output loading to achieve high voltage gain.

As described with respect to FIG. 2, the circuit may further include a tail current control circuit 319 connected between the voltage supply and the first and second cascode amplifiers. For example, the circuit 319 may comprise a bias voltage source 320 connected to the gate of a bias transistor 321. For example, the bias transistor may comprise a pFET having a source connected to VDDQ 318 and a drain connected to the sources of transistors 308 and 312.

The circuit may further include calibration signal sources 325, 326 provided by a calibration circuit. The sources 325, 326 may provide a digital DC offset cancellation to mitigate transistor mismatch due to process variation. The sources 325, 326 may further provide a dynamic rising/falling edge calibration signal to mitigate delay variation due to process variation and pFET and nFET process skew. In some implementations, such as a device that will be operating in slave mode, this calibration may be omitted.

In the illustrated example, the first transistor 307 of the first cascode amplifier 306 may comprise a pFET 307, a source connected to a source of the clamp transistor 316, the first calibration signal input 325, and the drain of input transistor 303; a drain connected to the self-biasing line 324 and the drain of the output loading transistor 309; and a gate connected to the self-biasing line. The second transistor 308 of the cascode amplifier 306 may comprise a pFET 308 having a source connected to the drain of the bias transistor 321, a drain connected to a drain of the first clamp transistor 316, and a gate connected to the self-biasing line 324. In this example, the output loading transistor 309 comprises an nFET having a drain connected to the self-biasing line 324 and the drain of transistor 307, a source connected to ground (VSS) and a gate connected to the self-biasing line 324.

In this example, the first transistor 311 of the second cascode amplifier 310 comprises a third pFET 311 having a source connected to a source of second clamp transistor 317, the second calibration signal input 326, and the drain of the second differential input transistor 304; a drain connected to a signal output 327 and the drain of the second output loading transistor 313; and a gate connected to the self-biasing line 324. The second transistor 312 of the second cascode amplifier 310 comprises a fourth pFET 312 having source connected to the drain of the bias transistor 321 and the source of the second pFET 308, a drain connected to a drain of the second clamp transistor 317 and a gate connected to the self-biasing line 324. Here, the output loading transistor 313 comprises an nFET having a gate connected to the self-biasing line 324, a drain connected to the drain of pFET 311 and the output 327, and a source connected to VSS.

FIG. 3B illustrates an example calibration circuit. Circuit 330 applies a calibration bias voltage 332 to the gates 336, 337, 338, 339 of transistors 340, 341, 342, 343 based on the enable bits 328. Transistors 340, 341, 342, 343 are sized to allow binary-encoded control of the calibration current between a minimum level and a maximum level at predetermined increments. For example, the transistors 340-343 may allow a calibration current between −100 µA to 100 µA to be applied to 325 or 326 in increments of 12.5 µA. Select inputs 334, 335 allow the calibration to be applied to either 325 (in the case of <selp,seln>=<1,0>) or to 326 (in the case of <selp,seln>=<0,1>).

Calibration may occur during system initialization. An example calibration procedure for DC offset cancellation may include first setting both differential inputs 301, 302 to a common, predetermined voltage, setting <selp,seln>=<1, 0>, and enb<3:0>=d15 so that the output 327=0. Next, control logic may decrement enb<3:0> one by one from d15 to d0 until the output 327 changes from 0 to 1. If the change occurs, the setting of <selp,seln> and enb<3:0> that caused the change may be stored in a control/status register (CSR) for use during normal system operation. If the change does not occur, then <selp,seln> is set to <0,1>. Then, enb<3:0> is incremented from d0 to d15 until the output 327 changes from 0 to 1. The values for which occurs are stored in the CSR for use during normal system operation.

An example calibration procedure for dynamic rising/falling edge calibration may proceed as described with respect to the example DC calibration. However, instead of applying a constant reference voltage at inputs 301, 302, a common rising edge signal is applied to the inputs 301, 302. A latch with an adjustable edge clock is used to capture the timing of the output rising edge. Once this occurs, the input switches to falling edge and enb<3:0> and <selp,seln> are swept until the latch is able to capture the falling edge. The corresponding values are then stored in a CSR for rising/falling edge calibration during operation.

Figure 4:
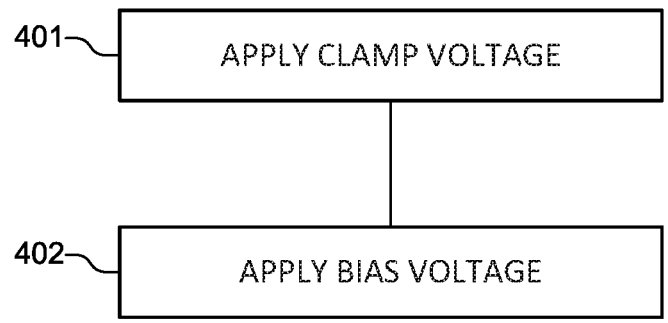
FIG. 4 illustrates an example method of operating a differential amplifier.

FIG. 4 illustrates an example method of operating a differential amplifier. For example, the differential amplifier may be implemented as described with respect to FIG. 1, 2, or 3.

The example method includes block 401. Block 401 comprises applying a clamping voltage to a gate of a first clamp transistor and a gate of a second clamp transistor. For example, as described above, the first clamp transistor may be connected to a source of a first transistor of a first cascode amplifier and may be connected to a drain of a second transistor of the first cascode amplifier. The second clamp transistor may be connected to a source of a first transistor of a second cascode amplifier and may be connected to a drain of a second transistor of the second cascode amplifier.

The example method further includes block 402. Block 402 comprises applying a bias voltage to a gate of a bias transistor. For example, the bias transistor may have a source connected to a voltage supply and a drain connected to the source of the second transistor of the first cascode amplifier and the second transistor of the second cascode amplifier.

Figure 5:
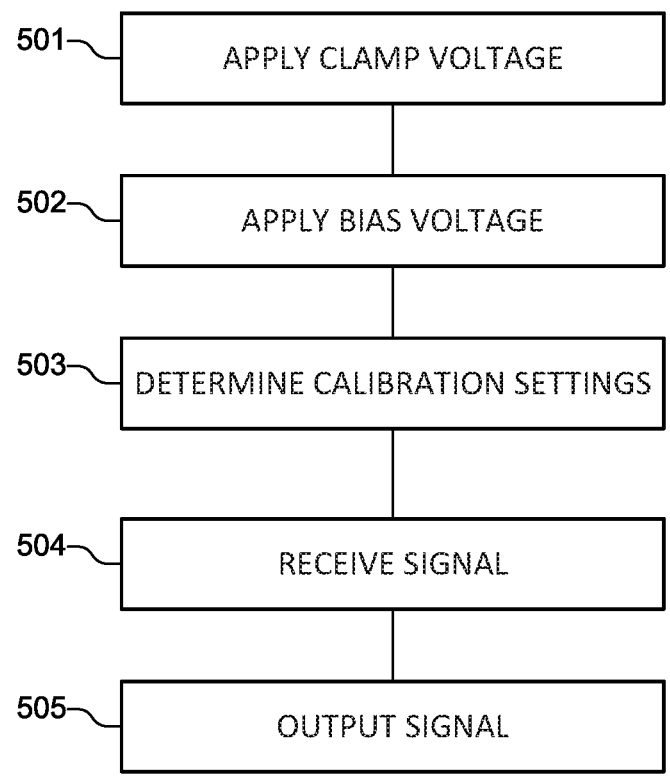
FIG. 5 illustrates another example method of operating a differential amplifier.

FIG. 5 illustrates another example method of operating a differential amplifier. For example, the illustrated method may be performed by a device communicating on a memory channel, such as a memory controller or a memory module. For example, the differential amplifier may be implemented as described with respect to FIG. 1, 2, or 3.

The method includes block 501. Block 501 comprises applying a clamping voltage to a gate of a first clamp transistor and a gate of a second clamp transistor. For example, block 501 may proceed as described with respect to block 401 of FIG. 4.

The method includes block 502. Block 502 comprising applying a bias voltage to a gate of a bias transistor. For example, block 502 may proceed as described with respect to block 402 of FIG. 4.

The example method includes block 503. Block 503 comprises determining calibration settings for the differential amplifier for use during normal operation. For example, block 503 may comprise incrementing a calibration current while applying an equal reference voltage inputs of the amplifier to generate a DC offset voltage for the receiver. As another example, block 503 may comprise generating a dynamic rising and falling edge calibration signal by incrementing a calibration current while applying a varying calibration signal to the signal inputs. For example, block 503 may include the calibration operations described with respect to FIGS. 3A and 3B.

The example method further includes block 504. Block 504 comprises receiving a differential signal via a first signal input and a second signal input. As described above, the first signal input may be connected to the source of the first transistor of the first cascode amplifier and may be connected to the drain of the second transistor of the first cascode amplifier. The second signal input may be connected the source of the first transistor of the second cascode amplifier and may be connected to the drain of the second transistor of the second cascode amplifier.

The example method further includes block 505. Block 505 comprises outputting an output signal via a signal output connected to the drain of the first transistor of the second cascode amplifier.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A differential amplifier, comprising:
    a first differential signal input connected to a first cascode amplifier, the first cascode amplifier comprising a first pair of transistors;
    a second differential signal input connected to a second cascode amplifier, the second cascode amplifier comprising a second pair of transistors; and
    a clamp voltage source connected to a gate of a first clamp transistor interposed between the first pair of transistors and connected to a gate of a second clamp transistor interposed between the second pair of transistors.

2. The differential amplifier of claim 1, further comprising a bias transistor comprising:
    a source connected to a voltage supply (VDDQ);
    a gate connected to a bias voltage source; and
    a drain connected to the first and second cascode amplifiers.

3. The differential amplifier of claim 2, wherein the first clamp transistor comprises a n-type field effect transistor (nFET) and the first cascode amplifier comprises a first p-type field effect transistor (pFET) and a second pFET,
    the first pFET having a source connected to a source of the first clamp transistor, a drain connected to a self-biasing line, and a gate connected to the self-biasing line; and
    the second pFET having a source connected to the drain of the bias transistor, a drain connected to a drain of the first clamp transistor, and a gate connected to the self-biasing line.

4. The differential amplifier of claim 3, further comprising a high-impedance output loading transistor comprising a n-type FET (nFET) having a drain connected to the self-biasing line, a gate connected to the self-biasing line, and a source connected to ground.

5. The differential amplifier of claim 4, wherein the second clamp transistor comprises a n-type field effect transistor (nFET) and the second cascode amplifier comprises a third pFET and a fourth pFET,
    the third pFET having a source connected to a source of second clamp transistor, a drain connected to a signal output, and a gate connected to the self-biasing line; and
    the fourth pFET having source connected to the drain of the bias transistor, a drain connected to a drain of the second clamp transistor and a gate connected to the self-biasing line.

6. The differential amplifier of claim 5, further comprising a second high-impedance output loading transistor comprising a second nFET having a drain connected to the drain of the third pFET, a source connected to ground, and a gate connected to the self-biasing line.

7. The differential amplifier of claim 6, further comprising a calibration circuit having a first output connected to the source of the first pFET and a second output connected to the source of the third pFET.

8. A device, comprising:
    a first differential signal input connected to a first cascode amplifier;
    a second differential signal input connected to a second cascode amplifier;
    a signal output connected to the first and second cascode amplifiers;
    a voltage swing clamp circuit connected to the first and second cascode amplifiers and comprising a first clamp transistor between a first pair of transistors of the first cascode amplifier and a second clamp transistor between a second pair of transistors of the second cascode amplifier;
a voltage supply (VDDQ) connected to the first and second cascode amplifiers; and
a tail current control circuit connected between the voltage supply and the first and second cascode amplifiers.

9. The device of claim 8, wherein the tail current control circuit comprises a transistor controlled by a bias voltage source.

10. The device of claim 9, wherein the first cascode amplifier comprises a first p-type field effect transistor (pFET) and a second pFET,
the first pFET having a source connected to the drain of the bias transistor, a drain connected to a drain of the first clamp transistor, and a gate connected to a self-biasing line; and
the second pFET having a source connected to a source of the clamp transistor, a drain connected to the self-biasing line, and a gate connected to the self-biasing line.

11. The device of claim 10, wherein the second cascode amplifier comprises a third pFET and a fourth pFET,
the third pFET having a source connected to a source of second clamp transistor, a drain connected to a signal output, and a gate connected to the self-biasing line; and,
the fourth pFET having source connected to the drain of the bias transistor, a drain connected to a drain of the second clamp transistor and a gate connected to the self-biasing line.

12. The device of claim 11, wherein the first, second, third, and fourth pFETs are oxide thin-film transistors.

13. The device of claim 11, further comprising:
a first high-impedance output loading transistor comprising a n-type FET (nFET) having a drain connected to the self-biasing line, a gate connected to the self-biasing line, and a source connected to ground; and
a second high-impedance output loading transistor comprising a second nFET having a drain connected to the drain of the fourth pFET, a source connected to ground, and a gate connected to the self-biasing line.

14. The device of claim 13, further comprising:
a third nFET having a drain connected to a source of a first input transistor and a source of a second input transistor, a source connected to ground, and a gate connected to the self-biasing line.

15. The device of claim 13, further comprising a calibration circuit having a first output connected to the source of the second pFET and a second output connected to the source of the fourth pFET.

16. A method, comprising:
applying a clamping voltage to a gate of a first clamp transistor and a gate of a second clamp transistor,
the first clamp transistor connected to a source of a first transistor of a first cascode amplifier and connected to a drain of a second transistor of the first cascode amplifier, and
the second clamp transistor connected to a source of a first transistor of a second cascode amplifier and connected to a drain of a second transistor of the second cascode amplifier; and
applying a bias voltage to a gate of a bias transistor, the bias transistor having a source connected to a voltage supply and a drain connected to the source of the second transistor of the first cascode amplifier and the second transistor of the second cascode amplifier.

17. The method of claim 16, further comprising
receiving a differential signal via a first signal input and a second signal input,
the first signal input connected to the source of the first transistor of the first cascode amplifier and connected to the drain of the second transistor of the first cascode amplifier;
the second signal input connected the source of the first transistor of the second cascode amplifier and connected to the drain of the second transistor of the second cascode amplifier; and
outputting an output signal via a signal output connected to the drain of the first transistor of the second cascode amplifier.

18. The method of claim 17, wherein the differential signal comprises an equal reference voltage applied to the first signal input and the second signal input, and further comprising:
incrementing a calibration current while applying the reference voltage to generate a DC offset voltage for a receiver.

19. The method of claim 18, further comprising generating a dynamic rising and falling edge calibration signal by incrementing the calibration current while applying a varying calibration signal to the first and second signal inputs.

* * * * *